United States Patent [19]

Feuchtbaum et al.

[11] 4,009,816
[45] Mar. 1, 1977

[54] METHOD AND APPARATUS FOR INCREASING EFFICIENCY OF A FOAM FLUXER USED IN WAVE SOLDERING OF PRINTED WIRING BOARDS

[75] Inventors: Robert B. Feuchtbaum, Rockaway; Fredrick C. Disque, Westfield, both of N.J.

[73] Assignee: Alpha Metals, Inc., Jersey City, N.J.

[22] Filed: Sept. 2, 1975

[21] Appl. No.: 609,227

[52] U.S. Cl. .......................... 228/207; 228/180 R; 427/96; 427/310
[51] Int. Cl.² ...................... B23K 1/08; H05K 3/00
[58] Field of Search .......... 228/37, 42, 207, 180 R; 427/96, 310; 148/23

[56] References Cited

UNITED STATES PATENTS

| 3,135,630 | 6/1964 | Bielinski | 228/37 |
| 3,216,643 | 11/1965 | Verter | 228/37 |
| 3,218,193 | 11/1965 | Isaacson | 228/37 |

*Primary Examiner*—Michael F. Esposito
*Attorney, Agent, or Firm*—Lerner, David, Littenberg & Samuel

[57] ABSTRACT

The gas supplied to a foam fluxer utilized for wave soldering is presaturated with a flux thinner compatable with the flux solvent utilized in the foam fluxer to eliminate evaporation of solvent in the foam fluxer and maintain the temperature and specific gravity of the flux solution constant.

7 Claims, 6 Drawing Figures

METHOD AND APPARATUS FOR INCREASING EFFICIENCY OF A FOAM FLUXER USED IN WAVE SOLDERING OF PRINTED WIRING BOARDS

BACKGROUND OF THE INVENTION

The first practical automated mass soldering technique developed for soldering printed wiring boards is wave soldering. In such a system, conveyors are utilized to either direct feed the printed circuit boards or a double chain conveyor carries board carriers or pallets. The printed circuit boards have a deposit of flux placed thereon by any one of three techniques, namely foam fluxers, wave fluxers or spray fluxers. Foam fluxers are utilized for single-sided and most double-sided printed circuit boards and normally there is a control deposit of flux on the printed circuit board Thereafter, the board is preheated and solder material is deposited utilizing any number of the different types of solder pots. After being conveyed through the solder unit, the printed circuit boards are cleaned and conveyed into a point where they can be removed from the soldering conveyor. The present invention is directed to the problems of foam fluxers utilized in such systems.

Over the years, many soldering fluxes have been developed for use in automated printed wiring board soldering. One class which is widely used is composed of liquid rosin fluxes. In foam application, finely dispersed air is passed through the flux causing it to foam. Then the printed circuit boards are passed over the foam to apply the uniform deposit of flux on the board. The success of this type of mass soldering depends upon having the materials and process variables under control at all times.

One process variable which creates problems is the composition of the foam fluxes. All methods of applying fluxes result in evaporation of the flux solvent through use. However, foam fluxing increases this problem because of the use of gas which causes greater evaporation of the solvent in the flux solution. Evaporation of the flux solvent results in a progressive increase in the specific gravity of the flux. As time goes on, the relative solid content of the flux increases with the result that more solids stay on the board.

Generally, the preheaters are set to flash off the flux solvent and preheat the printed wiring board to start the flux action and reduce thermal shock. As the flux film gets thicker, removal of flux solvent takes more of the heat, leaving less for starting flux action and less for reducing thermal shock. The result, of course, is a variation in the process for which the machine can't compensate. Another result of uncontrolled solvent evaporation is that flux consumption increases because drag-out on the boards is greater. Excessive flux also means increased cleaning costs. It, therefore, would appear obvious that it would pay to control flux specific gravity during its use.

Flux specific gravity can be controlled by measuring specific gravity and adjusting by adding thinner and/or solvent until the gravity is brought back to the correct value. This can be an effective means of control if done frequently enough and accurately enough. In practice, however, checks and adjustments tend to be too infrequent to maintain the control which is desirable. Solvent control is even more important in the case of foam fluxing than it is in the case of brush or wave fluxing. First, the evaporation rate is considerably greater when the gas is bubbled through a flux and, secondly the ratio of active ingredients and/or solids to solvent is critical in maintaining the foam-properties of the flux.

SUMMARY OF THE INVENTION

When gas passes through the flux solution it will absorb the solvent until it becomes saturated at that temperature. Gas saturated with a flux thinner, when bubbled through a flux solution can absorb no more solvent so that evaporation of solvent can't take place. Thus, if the gas utilized in the foam fluxer is presaturated with thinner before being introduced into the foam unit, very little evaporation and change in flux specific gravity will occur.

DETAILED DESCRIPTION OF THE DRAWINGS

Figure 1:
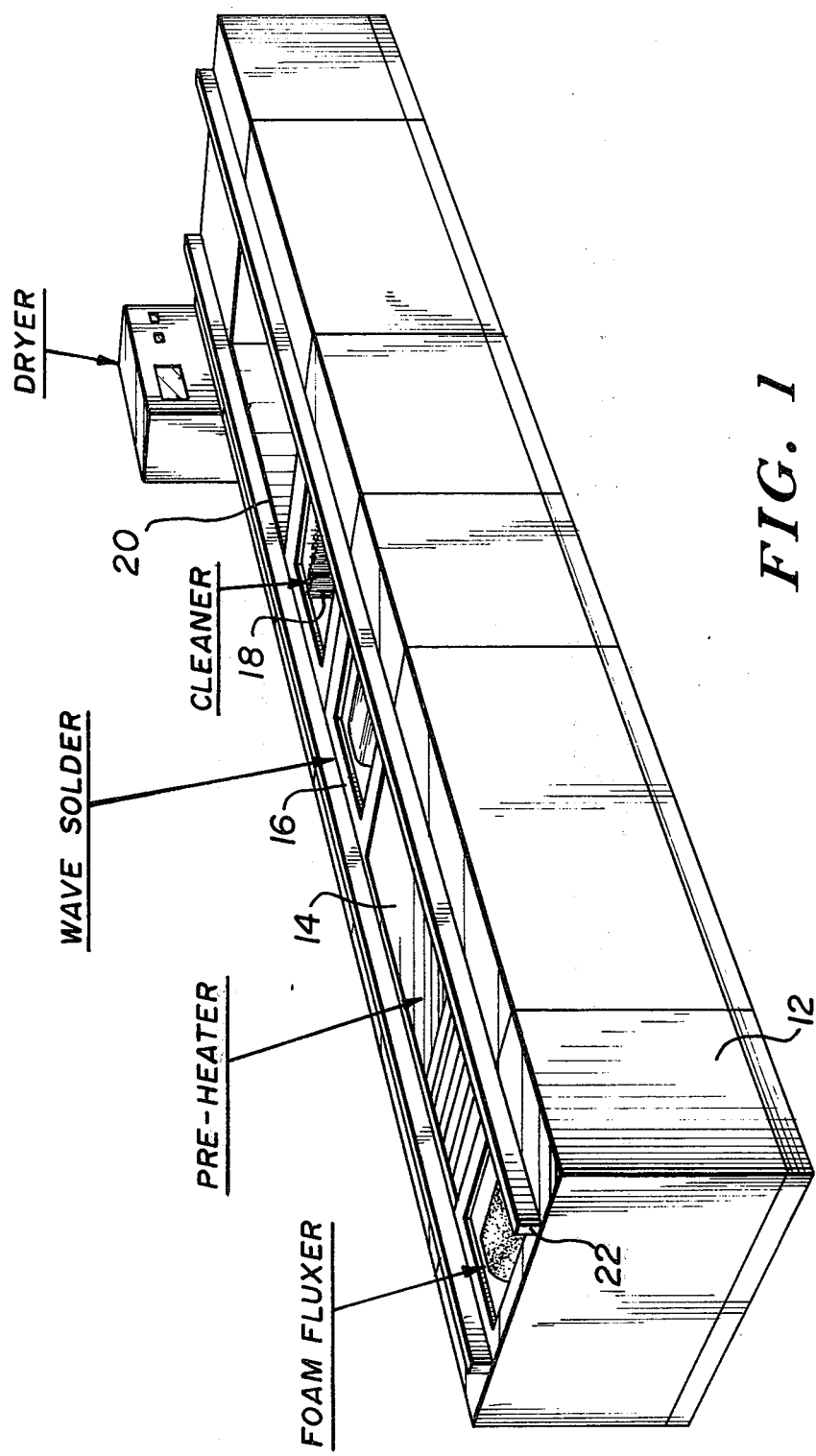
FIG. 1 is a schematic showing the wave flux system built in accordance with the principles of the present invention.

In FIG. 1, there is shown a conventional wave soldering system incorporating the principles of the present invention, and generally designated by the numeral 10. The system 10 includes a foam fluxer 12, preheater 14, wave solderer 16, cleaner 18 and drier 20, all mounted in line under a conveyor 22. In accordance with the system, printed wiring boards are moved by conveyor 22 first to foam fluxing station 12, which includes a constant level feed system operative to an aerator which supplies a constant flux deposit on the printed circuit wiring board. Thence, a conveyor carries the printed wiring boards to station 14 where they are preheated. Thereafter, the preheated flux printing wiring boards are fed to a wave solder unit 16 where a solder wave interfaces with the circuit board to coat the same. A suitable cleaner 18 then cleans off the remaining solution and the conveyor thence carries the boards to the drier 20 to complete the operation. What has been described above is standard technique in the industry.

Figure 2:
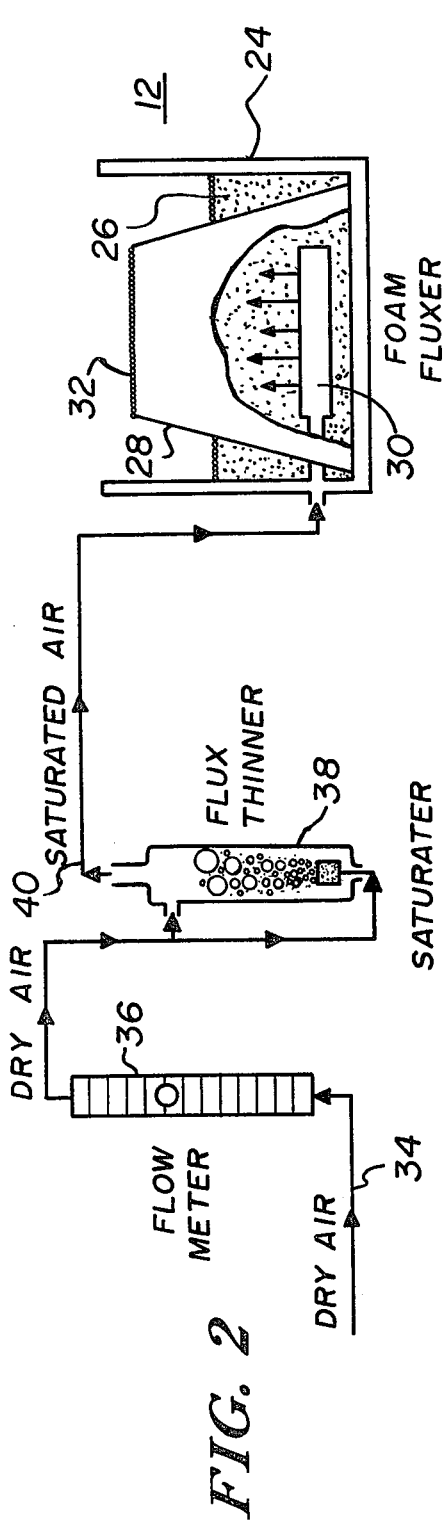
FIG. 2 is a schematic showing the foam fluxer and presaturator utilized in connection with the apparatus of FIG. 1.
Figure 6:
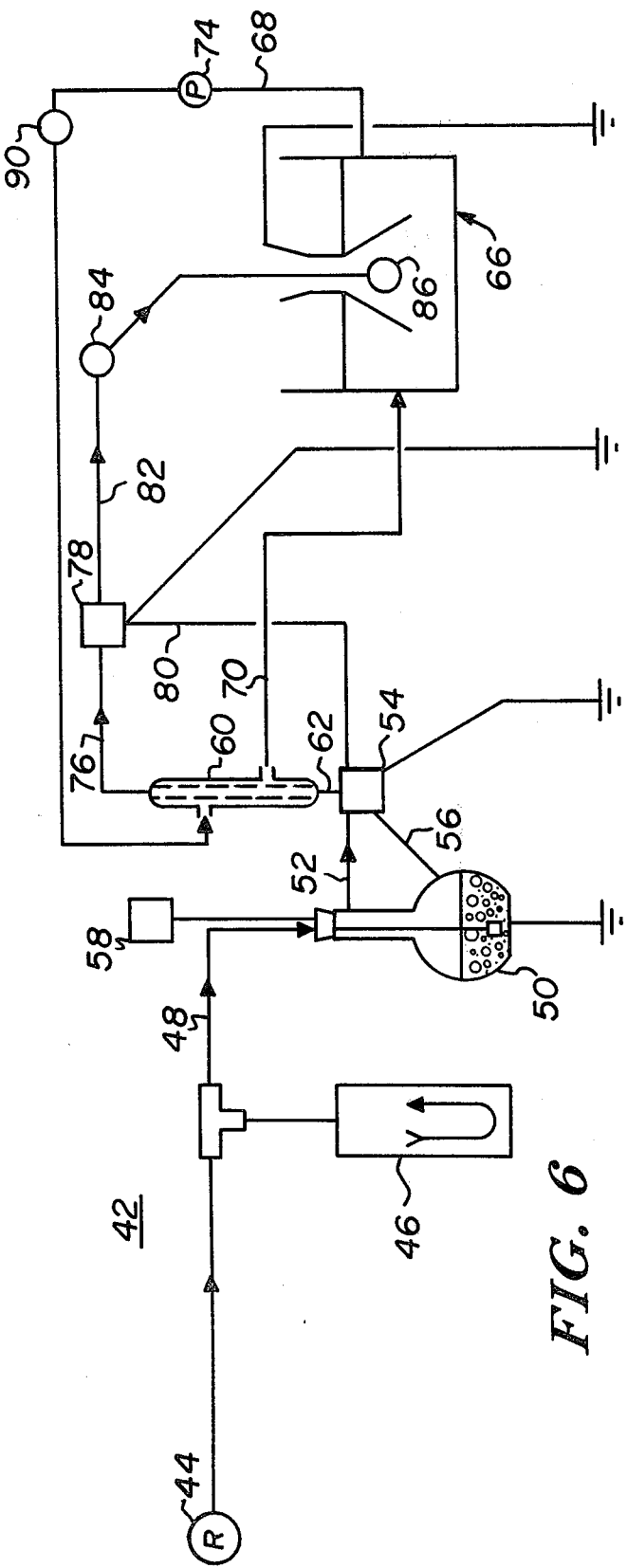
FIG. 6 is a schematic showing of another embodiment of the present invention.

The present invention is directed to the features of the foam fluxer which are provided in FIG. 2 and, alternatively, in FIG. 6. As has been stated previously, the solvent system for the liquid fluxes utilized in the foam fluxer is an important factor in determining the effectiveness of soldering chemicals. On exposure to air, solvents contained in most soldering chemicals begin to evaporate, thus changing the physical properties in the original material. Evaporation loss may adversely affect the surface tension, chemical activity, wetting power, resistance to abnormal changes, and basically the overall guality of the material. To avoid such evaporation in a foam fluxer, applicant has devised the system shown in FIG. 2. In FIG. 2, there is shown the foam fluxer 12 of the present invention in which the container 24 has filled therein foam flux solution 26. A central open-top chimney 28 is mounted in the center of the tank 24 and the solution 26 is in communication with both the interior and exterior of said chimney 28. At the bottom of the chimney 28 is placed a suitable aerator 30 in a conventional manner. As gas bubbles through the aerator 30, it causes the flux solution within the chimney 28 to bubble up through the top 32 thereof and thence down to be returned to the tank 24 on the outside of the chimney 28. Ordinarily, these printed circuit boards are moved past the top 32 and are uniformly coated by their passage across the top 32 by the foamed flux.

In accordance with the present invention, gas is supplied through conduit 34 to the system. This gas passes first through a flowmeter 36 for measurement thereof and is then fed to a saturator 38. The gas is bubbled through flux thinner placed within the saturator 38 so that the output 40 of the saturator 38 receives gas saturated with flux thinner compatible with the solvent flux solution 26. The saturated gas is then supplied to the foam flux aerator 30 and bubbled through the foam flux solution.

The present invention was compared to a commercial foam fluxing unit filled with a standard amount of flux solution. Gas (without presaturation) was bubbled through the fluxer at a constant rate and the flux temperature, flux specific gravity amd flux weight were determined at time intervals. Thereafter, a second experiment was run in which the dry gas was saturated with the flux solvent, as per the present invention described in FIG. 2 before passing through the flux solution. As before, temperature, specific gravity, and flux weight were recorded at certain time intervals. The results are as shown below on Table I:

TABLE I

| Elapsed Time (min) | Flux Temp. (° F) | Flux Sp. Gr.* (g/ml) | Flux Wt. Loss (%) |
|---|---|---|---|
| Unsaturated Gas | | | |
| 0 | 68 | .8505 | 0 |
| 11 | 66 | | 0.99 |
| 45 | 62 | | 3.32 |
| 63 | 62 | | 4.51 |
| 100 | 60.5 | | 6.84 |
| 126 | 59.5 | | 8.32 |
| 241 | 58.5 | | 14.82 |
| 300 | 58 | | 18.09 |
| 342 | 58 | .8645 | 20.82 |
| Solvent or Thinner Presaturated Gas | | | |
| 0 | 70 | .8505 | 0 |
| 10 | 70 | | 0.51 |
| 37 | 69 | | 1.29 |
| 58 | 69 | | 1.96 |
| 95 | 69 | | 2.84 |
| 131 | 69 | | 3.62 |
| 218 | 71 | | 4.04 |
| 255 | 70.5 | | 5.02 |
| 302 | 71 | | 6.06 |
| 328 | 70 | .8570 | 6.56 |

*Measured at 77° F

During the unsaturated gas run, the room temperature rose slightly from 73.6° to 75.5° F. The flux temperature fell from 68° to 58° F in 342 minutes. If there had been no evaporation of the flux solvent, the flux temperature should have increased as the room temperature increased. The fact that the temperature fell indicated that flux solvent evaporation took place. With presaturated dry gas, there is some temperature drop due to water being withdrawn from the flux solution. This occurred from the well-known physical fact that when liquid is converted to a vapor, the energy needed to bring about the change comes from the liquid phase. The result of such evaporation is a loss of kinetic energy and the lowering of the temperature of the liquid.

During the presaturated gas run described above, utilizing the apparatus of FIG. 2, the room temperature rose from 74.6° to 76.6° F. The flux temperature remained essentially constant. The fact that the flux temperature remained constant would indicate that there was little or no flux solvent evaporation taking place. This is not rigorously correct because a slight change in flux specific gravity was observed and this could only occur with a loss of flux solvent. The solvent loss which did occur could be explained by one of the following reasons:

a. The gas was not completely saturated with flux vapor and removed additional solvent from the flux;

b. The temperature of the gas was lowered as it passed through the saturator. When it reached the flux which was warmer, the air absorbed more solvent.

c. Some flux was lost due to air entrainment which results in liquid not being returned to the tank.

The slight solvent loss could have been reduced more by maintaining the saturator temperature (by heating) the same as the flux temperature and insuring that the saturator allowed complete saturation of the gas.

Figure 3:
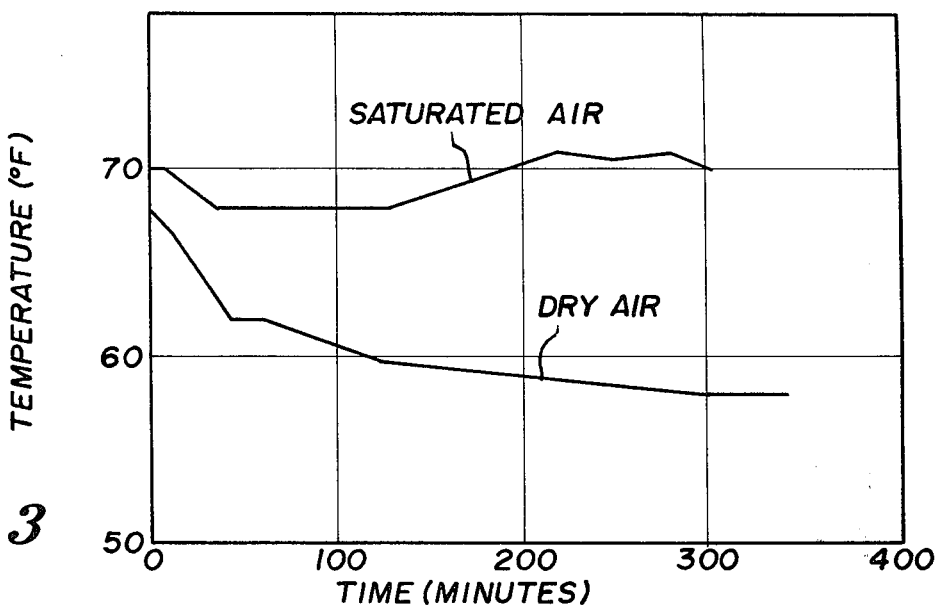
FIG. 3 is a graph of time vs. temperature for saturated and unsaturated gas utilizing the system of FIG. 2.
Figure 4:
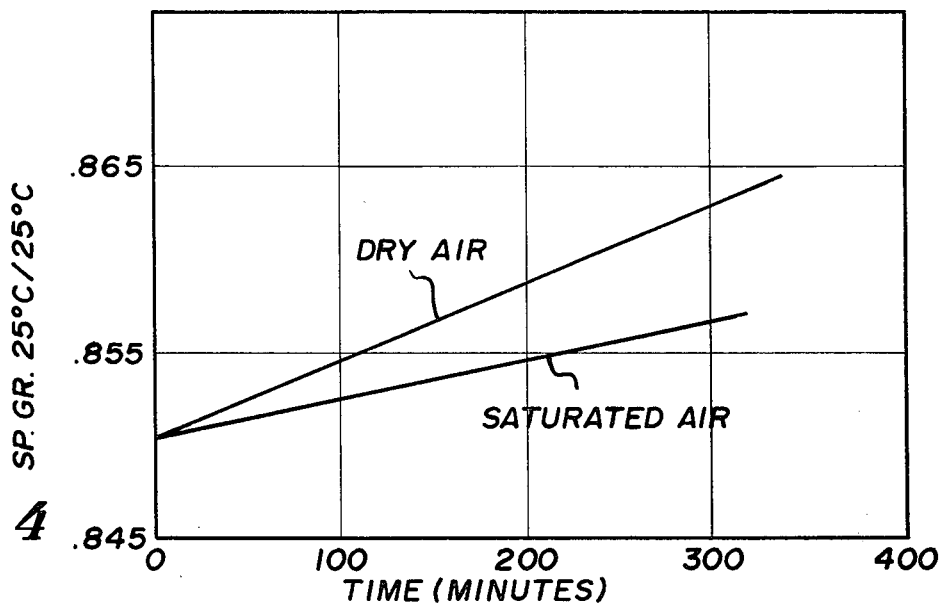
FIG. 4 is a graph of specific gravity with respect to time of saturated and dry gas utilizing the apparatus of the present invention.

The flux temperature vs. time changes are shown in FIG. 3. Specific gravity changes with respect to time are shown in FIG. 4. In FIG. 4, starting at 0.8505, the specific gravity of the foam flux increased to 0.8645 g/ml during 342 minutes of foaming with dry gas. This corresponds to a change in rosin content of 25% to 31%. With presaturated gas, the specific gravity increased only from 0.8505 to 0..8570 g/ml during 139 minutes of foaming. This corresponds to a change in rosin content from 25% to 27.79%.

Figure 5:
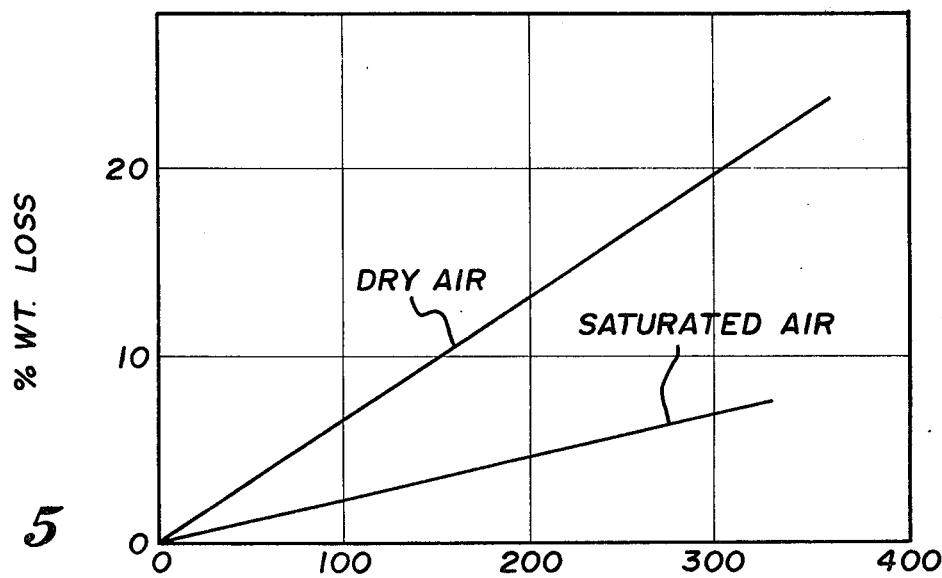
FIG. 5 is a graph of percentage of weight loss vs. time for saturated and dry gas utilizing the present invention.

In FIG. 5, there is shown a graph of percent weight loss per unit time for dry gas and presaturated gas. With dry gas, the flux lost 20.87% of its original weight in 342 minutes. With saturated air, the loss was 6.56% in 328 minutes. These losses represent loss of flux as it is entrained and carried away by air currents plus loss of flux solvent by evaporation. The lower figure for presaturated gas reflects the fact that evaporation was practically eliminated. Thus, it can be seen that there is a substantial saving in cost of flux utilizing the present invention. Of course, there may be an increased cost in use of flux thinner, but overall, the resultant better products in the wave soldering unit more than justifies, economically, the utilization of the present invention. Thus, there are improved flux performances because specific gravity remains constant. Additionally, the need for manual maintenance has been eliminated thus reducing labor costs. Flux consumption is reduced becuse the film thickness is maintained constant and there is less loss due to evaporation. Further, there is reduced cleaner consumption because the amount of rosin per board is maintained constant.

In FIG. 6, there is shown a second embodiment of the present invention herein designated by the numeral 42. In the system as shown in FIG. 6, gas enters through a two-stage regulator 44 and thence to a drier 46 wherein the gas is dried to remove moisture content. Thereafter, the gas is passed through line 48 to a saturator 50 which bubbles the gases through a thinner or solvent compatible with the foam flux solution. After passing through the thinner or solvent, the saturating gas passes through outline 52 to a condensate sump 54. The condensate sump 54 takes any retained droplets and returns them via line 56 to the saturator 50. A reservoir 58 also maintains the saturator 50 filled with thinner. The gas, after passing through line 52, passes upwardly through a temperature compensator 60. Here, the gases in line 62 are maintained at the temperature of the foam flux solution in the foam fluxer 66 by receiving foam flux solution from line 68 through a suitable jacket and thence is returned by line 70 to the foam fluxer 66. A suitable pump 74 operates to pump the foam solution to the temperature compensator 60. After passing through the temperature compensator, the gas passes through line 76 to an entrainment remover 78. Any entrained droplets are picked off and returned by line 80 back through sump 54 to line 56 and thence returned to the saturator 50. In this way, there is little loss of thinner during the operation and the gas which now passes out through line 82 and flowmeter 84 is fed to aerator 86 at the same temperature as the foam flux solution in the foam fluxer 66. Further, the air is fully saturated. In this way, better saturation is achieved. Additionally, the air is always at the temperature of the foam flux solution so there is no temperature loss. All of the parts of the system are grounded to prevent static charges and discharges. Maintenance of the foam fluxer at ground potential improves the quality of the foam because it removes the adverse effects of static charge build-up which has a tendency to break the foam and reduce wetting of the chimney due to the repulsion of like charges. In other systems, it may be desirable, because of temperature losses inherent in the system, to raise the temperature of the foam flux solution in line 68 prior to being fed to temperature compensator 60. In this regard, a preheater 90 is provided. It has been found that if the temperature is raised to about 5° C above the temperature of the foam flux solution, that this will compensate for all losses in the system prior to the foam flux solution being returned from line 70 to the foam fluxer 66.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

I claim as my invention:

1. A method of foam fluxing a wiring board which is to be wave soldered comprising the steps of supplying a foam fluxer, filling said foam fluxer with a quantity of flux solvent solution, providing a source of gas, saturating said gas with a flux thinner compatible with said solvent in said flux solvent solution, feeding said saturated gas to said foam fluxer at a rate sufficient to effect a desired degree of foaming therein and to produce a foam flux, and thereafter applying said foam flux to said wiring board whereby the temperature and specific gravity of said foam flux will remain substantially constant during subsequent wave soldering operations.

2. The method of claim 1 further comprising the step of removing water vapor from said gas prior to saturating said gas with said flux thinner.

3. The method of claim 1 further comprising the step of removing entrained droplets of flux thinner from said saturated gas and collecting said removed droplets for later use.

4. The method of claim 1 wherein said gas is air.

5. The method of claim 1 further comprising the step of subjecting the fluxed wiring board to a wave soldering operation.

6. The method of claim 1 further comprising the step of adjusting the temperature of said saturated gas to approximately the temperature of said flux solvent solution prior to supplying said gas to said foam fluxer.

7. The method of claim 6 wherein said temperature adjustment step comprises heating said saturated gas to a temperature slightly higher than the temperature of said foam flux solution to thereby compensate for temperature losses during the supply of said saturated gas to said foam fluxer.

* * * * *